United States Patent [19]

Geisler, Jr.

[11] Patent Number: 4,830,677
[45] Date of Patent: May 16, 1989

[54] SOLAR GENERATOR

[76] Inventor: Herbert A. Geisler, Jr., Rt. #2--Box 27E, Decaturville, Tenn. 38329

[21] Appl. No.: 184,778

[22] Filed: Apr. 22, 1988

[51] Int. Cl.⁴ .............................. H02N 6/00; F24J 2/06
[52] U.S. Cl. ...................................... 136/248; 136/246
[58] Field of Search ........................ 136/246, 248, 251

[56] References Cited

U.S. PATENT DOCUMENTS 4,081,289  3/1978  Campbell, III ...................... 136/246
4,337,758  7/1982  Meinel et al. ....................... 126/438
4,398,053  8/1983  Orillion ............................... 136/248

Primary Examiner—Aaron Weisstuch
Attorney, Agent, or Firm—Richard C. Litman

[57] ABSTRACT

A solar generator utilizing both direct and diffused solar radiation to generate electrical and thermal energy comprising a diamond shaped enclosure, a spheroid solar cell array internal to the diamond shaped enclosure, air circulation means to cool the spheroid solar cell array and vent the hot air exhaust to a water storage tank or other facility and various control devices.

6 Claims, 6 Drawing Sheets

SOLAR GENERATOR

FIELD OF THE INVENTION

Background of the Invention

This invention relates to an apparatus which utilizes radiant energy of sunlight from both direct and diffused radiation and converts it into different forms of energy. The most notable form of energy conversion is electrical energy generation which is accomplished by focusing and reflecting the sunlight onto an array of photovoltaic cells. The invention also has the capability of converting the sunlight into thermal energy by a heat exchanger directing the hot exhaust air, which initially was used to cool the apparatus, into a storage tank for holding hot water or into one's home for keeping it warm during the colder months.

The invention can be designed such that multiple units are used simultaneously for larger applications. However, the invention is primarily designed for use by the average homeowner. The method of construction of the device is more fully described herein.

DESCRIPTION OF THE PRIOR ART

Various prior art solar energy devices and the like, as well as their apparatuses and the method of their construction in general, are known and found to be exemplary of the U.S. prior art. They are:

| U.S. Pat. No. | Inventor |
| --- | --- |
| 3,018,313 | D. A. Gattone |
| 4,132,221 | A. G. Orillion |
| 4,249,520 | A. G. Orillion |
| 4,332,973 | B. L. Sater |
| 4,398,053 | A. G. Orillion |
| 4,511,755 | K. Mori |
| 4,529,830 | M. Daniel |

U.S. Pat. No. 3,018,313, issued to Gattone, discloses a light gathering power converter that comprises an array of lenses for receiving, concentrating, and impinging light waves in convergent paths toward a focal point onto the surfaces of light sensitive cells to develop very large amounts of resultant electrical energy.

U.S. Pat. No. 4,132,221, issued to Orillion, discloses a solar heater in which a water tank is positioned within a pyramidal enclosure. However, only one-half of the pyramidal enclosure is light transmissive.

U.S. Pat. Nos. 4,249,520 and 4,398,053, also issued to Orillion, disclose a radiation energy collector positioned within a pyramidal enclosure, similar to his earlier patent. The difference is that U.S. Pat. No. 4,398,053 discloses an arrangement of photovoltaic cells around the base of the enclosure. Again, only-half of the pyramidal enclosure is light transmissive.

U.S. Pat. No. 4,332,973, issued to Sater, discloses an improvement in a photoelectric generator for conversion of radiation into electrical energy and a means to concentrate the incident radiation onto the most responsive region of its structure.

U.S. Pat. No. 4,511,755, issued to Mori, discloses a solar ray collection apparatus wherein a plurality of lenses and an equal number of light conducting means are mounted on at least one of the opposing surfaces of a lens mount.

U.S. Pat. No. 4,529,830, issued to Daniel, discloses an apparatus for collecting, distributing and utilizing solar radiation. It comprises a plurality of solar gathering cells and light collecting units which provide radiation as a single beam to the lens system.

These patents or known prior uses teach and disclose various types of solar energy collecting devices of sorts and of various manufactures, and the like, as well as methods of their construction. However, none of them, whether taken singly or in combination, disclose the specific details of the combination of the invention in such a way as to bear upon the claims of the present invention.

SUMMARY OF THE INVENTION

An object, advantage, and feature of the invention is to provide a novel mechanism that is safe, extremely efficient in use, and lends itself to converting sunlight into both electrical and thermal energy.

Another object of the invention is to provide a novel and improved method of construction of a solar device whereby means is incorporated therein to produce constant power regardless of the time of day and to minimize the loss of power in the event there is a cloud passing over.

These, together with other objects and advantages of the invention reside in the details of the process and the operation thereof, as is more fully hereinafter described and claimed. References are made to drawings forming a part hereof, wherein like numerals refer to like parts throughout.

DESCRIPTION OF THE PREFERRED EMBODIMENT

Figure 1:
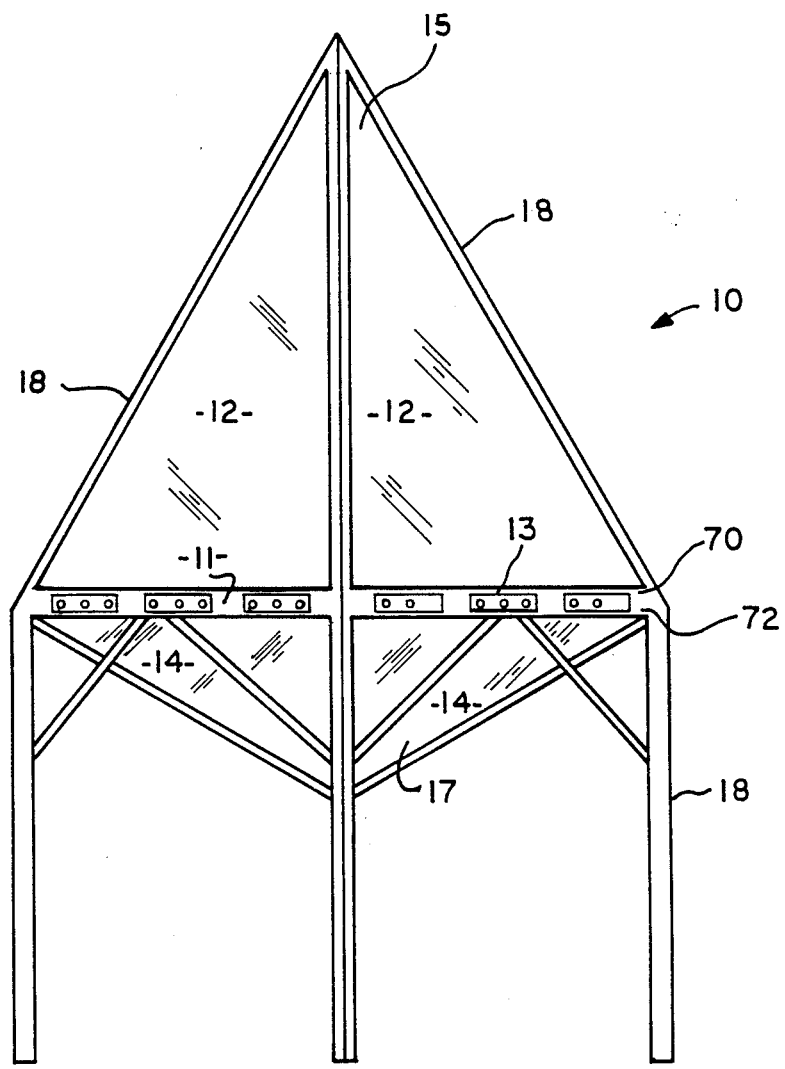
FIG. 1 is a side plan view of the solar generator illustrating a typical construction of the device according to a preferred embodiment and best mode of the present invention.
Figure 2:
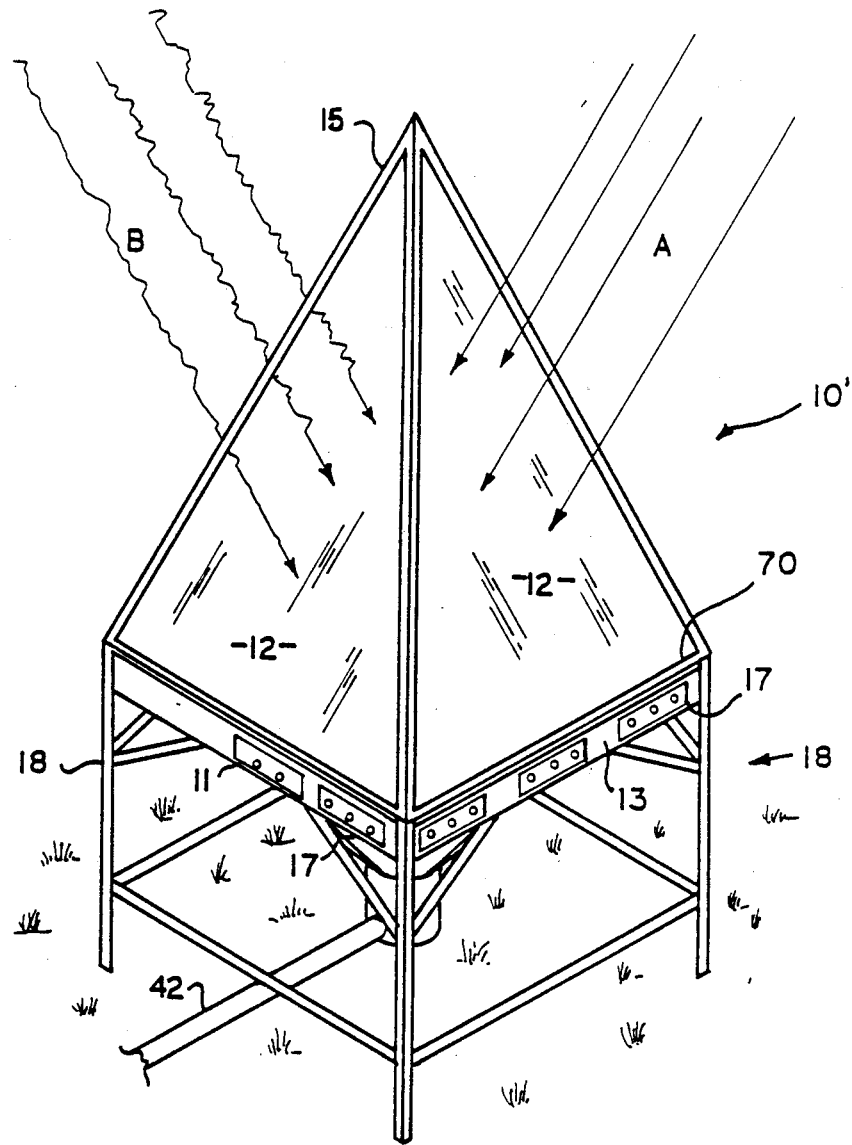
FIG. 2 is a top perspective view of the solar generator illustrating a typical construction of the device according to another embodiment of the present invention.
Figure 3:
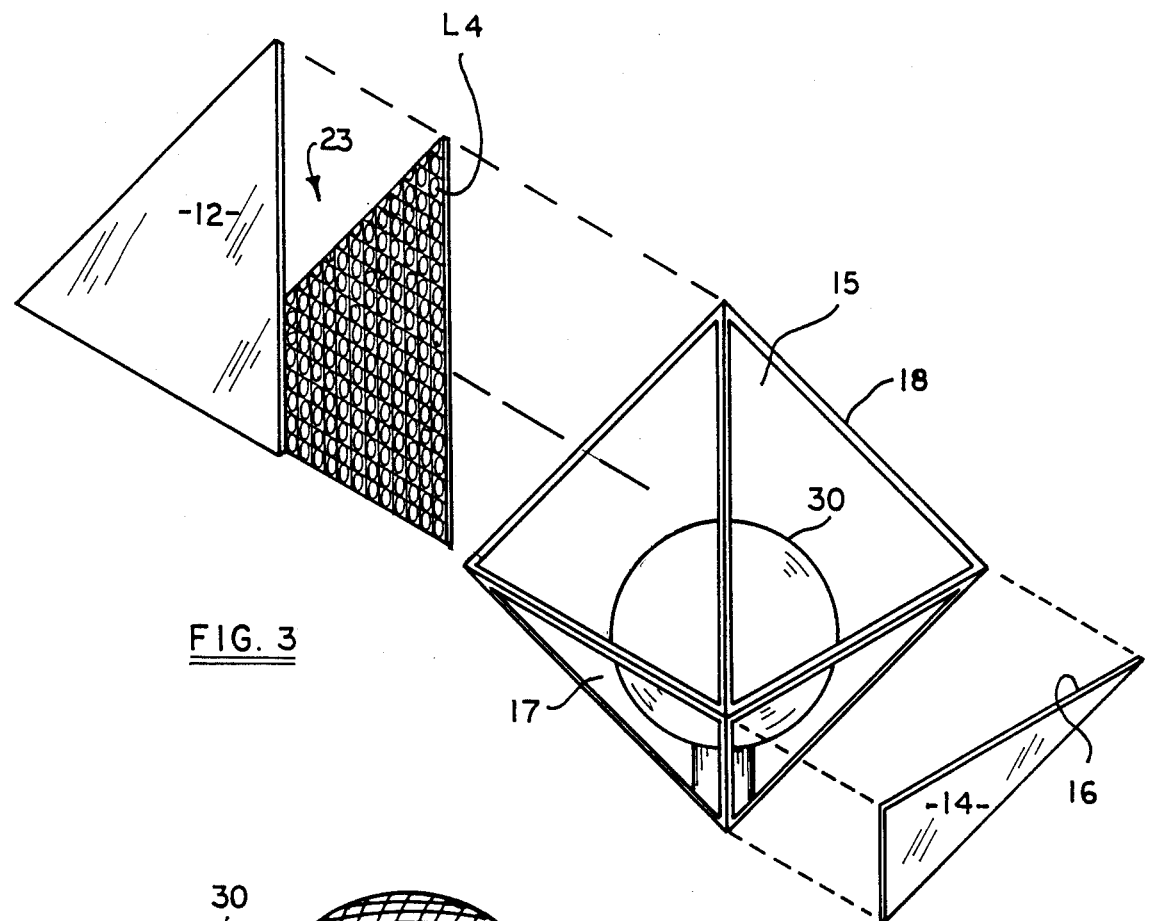
FIG. 3 is an exploded view of the solar generator according to a preferred embodiment and best mode of the present invention.
Figure 4:
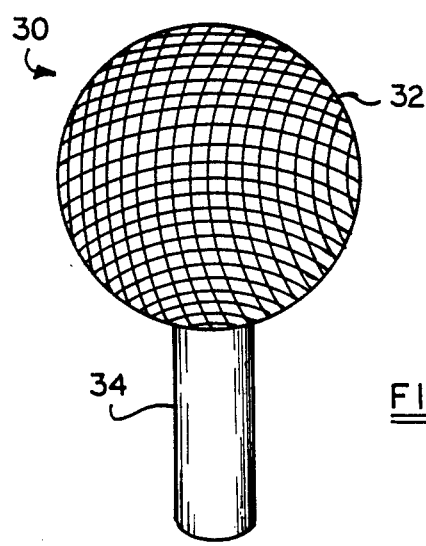
FIG. 4 is a side plan view of one of the components of the solar generator illustrating its embodying concepts.

Now referring to the figures, there is shown in FIGS. 1, 2, and 3 solar generators 10 and 10', that are used to convert solar radiation into both electrical and thermal energy. They consist of a diamond shaped enclosure having a top portion formed as an upper pyramid 15 with a base 70, a lower bottom portion formed as an inverted and similar geometrical form as a pyramid 17 with a base 72, a spherical array 30 and a support structure 18 which has control panels 11 and 13 disposed therein. Base 70 and base 72 are in the form of congruent squares. Also disposed within the upper pyramid 15 are four outer transparent panels 12 and four inner panels 23. The solar generators 10 and 10' are designed so that two panels 12 of the pyramid dome 15 can transmit direct sun light A and the other two panels can transmit diffuse light B at all times. The lower inverted pyramid 17 has four specular mirror polished stainless steel panels 14 disposed therein. These panels will be discussed in detail hereinafter.

As shown in FIG. 3, the solar generators 10 and 10' are equipped with a double paneled layer in the upper pyramid 15. The outer panel 12, is a triangular shaped, transparent layer of molded plastic. The transparency allows more light to be passed through the inner panel 23. The outer panel 12 is manufactured out of Lexan which guards against moisture and dust infiltration onto the second panel 23, and protection against breakage. The inner panel 23 has the identical shape as the outer panel 12. However, it has a plurality of focusing optical lenses 24 disposed therein. These optical lenses 24 concentrate the solar radiation onto a regular structure formed here as a spherical array 30 which is positioned within the solar generator by stand 34. The four panels 14 disposed within the lower inverted pyramid 17 have a reflective inner surface 16 of mirror polished stainless steel. The reflective surface 16 is more light directive for the side of the spherical array 30 that is away from the sun.

The spherical array 30 has a plurality of electrical conversion cells, preferably photovoltaic cells 32, disposed uniformly over the spherically shaped structure to absorb the solar radiation. The spherical array 30 makes the most efficient use of space and available light such that there is a minimal power shortage in the event that a cloud passes over. The sphere 30 is split between the upper pyramid 15 and the lower pyramid 17 and is equispaced symmetrically from the panels 23 of the upper pyramid 15 and also equispaced from the lower panels 14.

As shown in FIG. 2, the solar generator 10' has an insulated conduit 42 which allows warm air to dissipate from a heat exchange arrangement in the inside of enclosure including both the the upper and lower thermal load so that an external structure, such as a water storage tank or home, may be heated.

Figure 5:
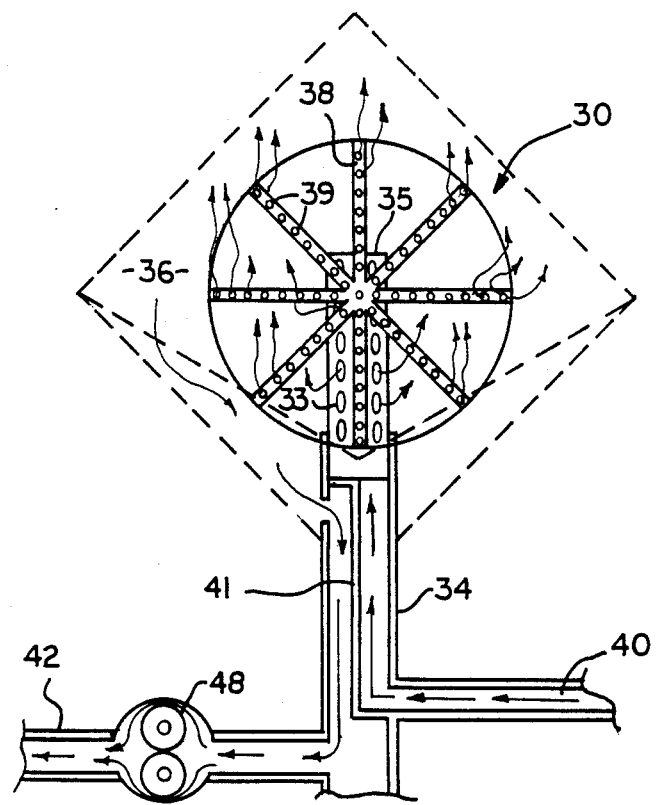
FIG. 5 is a side view of the internals of the component shown in FIG. 4 illustrating its construction according to both the preferred and alternate embodiments.

As detailed in FIG. 5, impeller 48 is disposed within the conduit 42 and creates a vacuum during operation such that cool air is drawn into the solar generator via the inlet conduit 40. The conduit 40 has access to the stand 34 which has an insulated divider 41 to separate the cool air intake from the hot air exhaust. Air is initially allowed to enter the spherical array 30 via the larger perforations 33 disposed within the internal frame 35 of the array 30. The cool air then forces the warm air, created by the radiation, out of the array by the smaller perforations 39 disposed within the outer frame 38 of the array 30. Once the warm air is out into the plenum 36, the fan suctions the hot air out of the solar generator and through the conduit 42 to an external thermal load such as a water storage tank or one's home.

Figure 7:
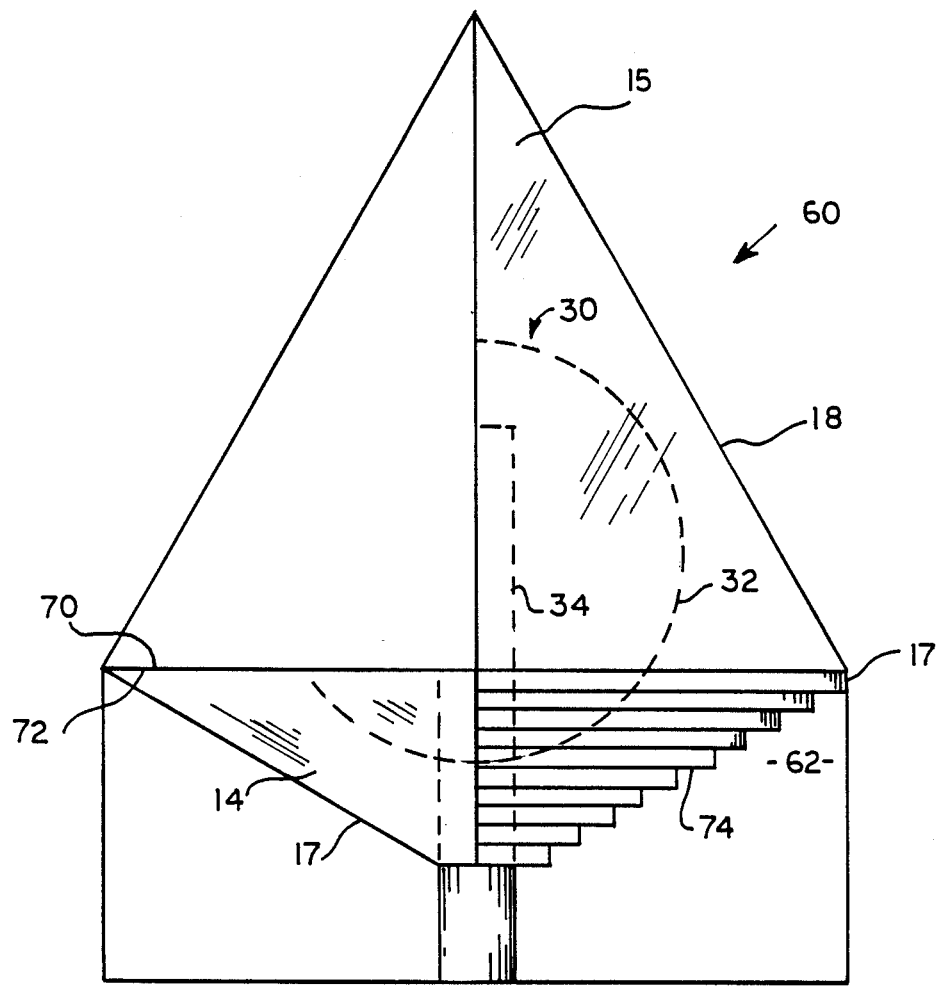
FIG. 7 is a dual view of the enclosure showing one side of the inverted bottom portions with cooling fins and one side without such fins.

As shown in FIG. 7, the panels 14 of the lower inverted pyramid 17 may also be equipped with metal fins 74 along its external walls for greater heat dissipation and more control of the output of the spherical array 30.

Figure 6:
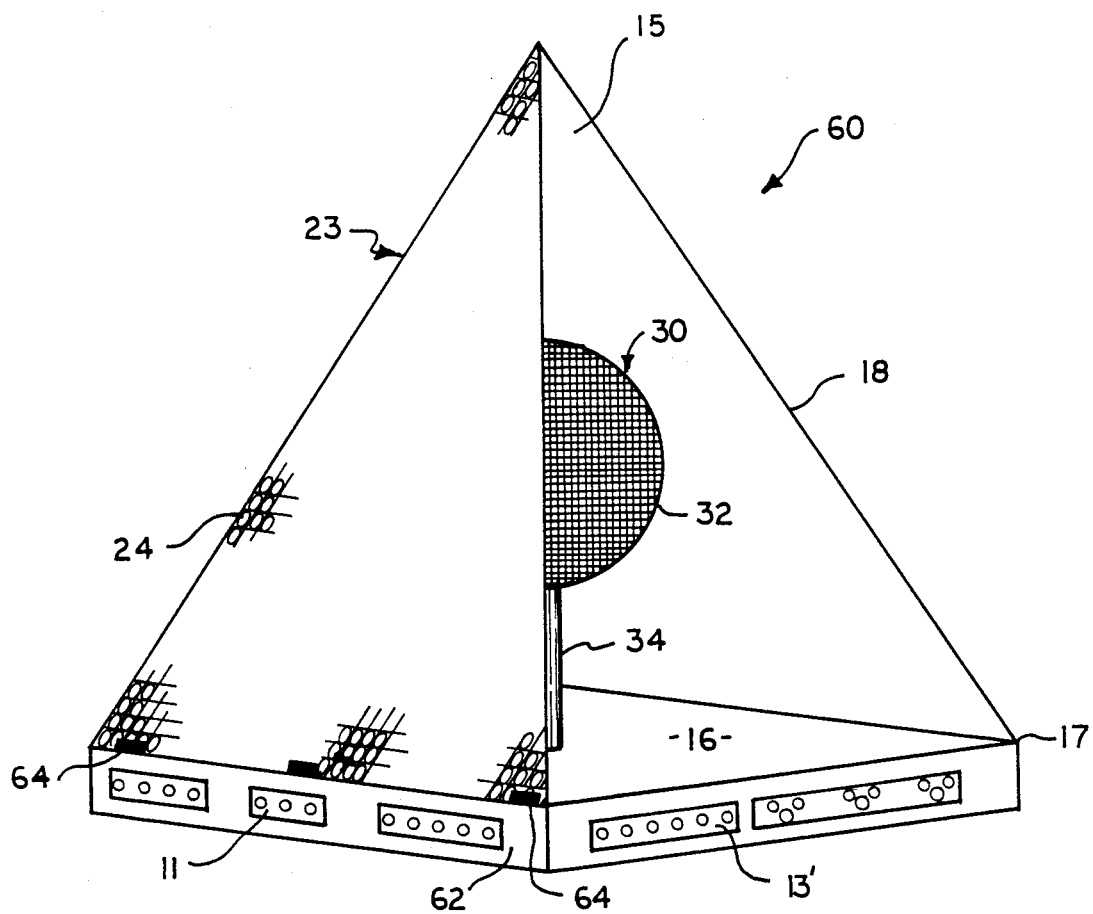
FIG. 6 is an exploded view of the solar generator illustrating a typical construction of the device according to yet another embodiment of the present invention.

As an alternate embodiment, the lower inverted pyramid 17 may be sunken into the ground to reduce the overall height of the solar generator 60 as shown in FIG. 6. In this case, the solar generator 60 would set on a concrete pad 62 having control panels 11' and 13' disposed therein. Insulator strips 64 would lie between the frame 18 and the concrete pad 62 to create an area for electrical wires and circuits and possibly a battery storage. The solar generator 60 also reduces the wind pressure on the upper pyramid dome 15 and reduces the overall cost of the system.

For the sake of maximizing the radiation absorbed in the enclosure the four corners of the congruent squares are set off at the points of the compass (NESW).

The foregoing is considered as illustrative only of the principles of the invention. Further, since numerous modifications and changes will readily occur to those skilled in the art, it is not desired to limit the invention to the exact construction and operation shown and described, and accordingly, all suitable modifications, and equivalents which may be resorted to, fall within the scope of the invention.

What is claimed is:

1. A device for conversion of the radiant energy of the sun into thermal and electrical energy, comprising;
   an enclosure with a top portion with a first base, and bottom portion with a second base contiguous with said first base, and said bottom portion is of a similar and inverted geometrical form as the top portion,
   said top portion comprising transparent and focusing panels,
   said bottom portion comprising reflective panels reflecting radiation in a generally upward direction,
   a regular shaped structure within said enclosure with an array of radiant energy to electrical energy conversion cells uniformly disposed over said regular shaped structure; and
   a heat exchange arrangement in said enclosure.

2. The device of claim 1 wherein
   said top portion is a pyramid and said bottom portion is an inverted pyramid and said first base and second base are congruent squares.

3. The device of claim 2 wherein
   the four corners of the congruent squares are set off at the points of the compass.

4. The device of claim 1 wherein
   said top portion has an outer set of four panels that are made of transparent molded plastic and an inner set of four panels that include an array of lenses, and
   said bottom portion includes four specular polished surfaces on said reflective panels.

5. The device of claim 4 further comprising;
   a combination of a stand supporting said regular shaped structure, said combination including said heat exchanger arrangement comprising a series of conduits and perforations,
   an impeller drawing air through said conduits and perforations;
   an external thermal load;
   said impeller drawing air from said series of conduits and perforations to said external thermal load.

6. The device of claim 4 wherein
   said regular shaped structure is a sphere;
   said array of radiant to electrical conversion cells comprising photovoltaic cells;
   said sphere being split between the interior of said top portion and the interior of said bottom portion and being equispaced symmetrically from all panels of the top portion pyramid and equispaced symmetrically from all the panels of the bottom portions pyramid.

* * * * *